United States Patent
Pandey et al.

(10) Patent No.: US 10,269,805 B2
(45) Date of Patent: Apr. 23, 2019

(54) APPARATUSES HAVING BODY CONNECTION LINES COUPLED WITH ACCESS DEVICES

(71) Applicant: Micron Technology, Inc., Boise, ID (US)

(72) Inventors: Deepak Chandra Pandey, Boise, ID (US); Haitao Liu, Boise, ID (US); Chandra Mouli, Boise, ID (US); Sanh D. Tang, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/895,928

(22) Filed: Feb. 13, 2018

(65) Prior Publication Data

US 2018/0374855 A1 Dec. 27, 2018

Related U.S. Application Data

(60) Provisional application No. 62/525,106, filed on Jun. 26, 2017.

(51) Int. Cl.
*G11C 5/02* (2006.01)
*G11C 5/06* (2006.01)
(Continued)

(52) U.S. Cl.
CPC .. *H01L 27/10814* (2013.01); *H01L 27/10852* (2013.01); *H01L 27/10873* (2013.01);
(Continued)

(58) Field of Classification Search
CPC ...... G11C 2213/71; G11C 5/06; H01L 27/108; H01L 27/10852; H01L 27/10873; H01L 29/7827
(Continued)

(56) References Cited

U.S. PATENT DOCUMENTS 7,332,418 B1 2/2008 Forbes
2006/0263973 A1* 11/2006 Thomas .............. H01L 21/3065
438/238

(Continued)

FOREIGN PATENT DOCUMENTS

WO  WO  5/2018
PCT/US2018/018059

*Primary Examiner* — Ly D Pham
(74) *Attorney, Agent, or Firm* — Wells St. John P.S.

(57) ABSTRACT

Some embodiments include an apparatus having a transistor associated with a vertically-extending semiconductor pillar. The transistor includes an upper source/drain region within the vertically-extending semiconductor pillar, a lower source/drain region within the vertically-extending semiconductor pillar, and a channel region within the vertically-extending semiconductor pillar and between the upper and lower source/drain regions. The transistor also includes a gate along the channel region. A wordline is coupled with the gate of the transistor. A digit line is coupled with the lower source/drain region of the transistor. A programmable device is coupled with the upper source/drain region of the transistor. A body connection line is over the wordline and extends parallel to the wordline. The body connection line has a lateral edge that penetrates into the vertically-extending semiconductor material pillar. The body connection line is of a different composition than the semiconductor material pillar.

22 Claims, 19 Drawing Sheets

(51) Int. Cl.
*H01L 27/108* (2006.01)
*H01L 29/78* (2006.01)

(52) U.S. Cl.
CPC ............ *H01L 29/7827* (2013.01); *G11C 5/06* (2013.01); *G11C 2213/71* (2013.01)

(58) Field of Classification Search
USPC .......................................................... 365/51
See application file for complete search history.

(56) References Cited

U.S. PATENT DOCUMENTS

| | | | |
|---|---|---|---|
| 2010/0148233 A1* | 6/2010 | Fujimoto | ............... H01L 27/108 257/296 |
| 2010/0265773 A1* | 10/2010 | Lung | .................. G11C 16/0458 365/185.27 |
| 2010/0297819 A1 | 11/2010 | Noble | |
| 2013/0146958 A1 | 6/2013 | Kim et al. | |
| 2013/0161730 A1* | 6/2013 | Pan | ................... H01L 27/10876 257/329 |
| 2013/0193400 A1 | 8/2013 | Sandhu et al. | |
| 2014/0061745 A1 | 3/2014 | Myung et al. | |
| 2014/0247674 A1* | 9/2014 | Karda | ..................... G11C 11/40 365/189.011 |
| 2015/0131381 A1* | 5/2015 | Rhie | ...................... G11C 16/14 365/185.17 |

\* cited by examiner

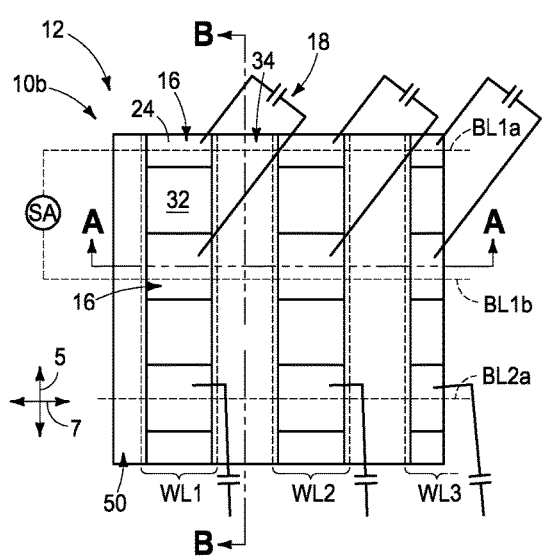
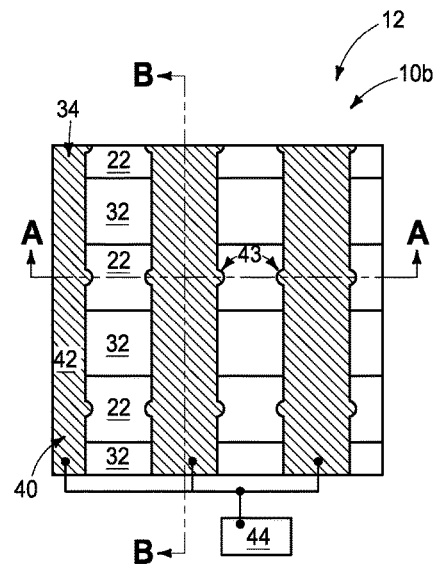
FIG. 3      FIG. 3C
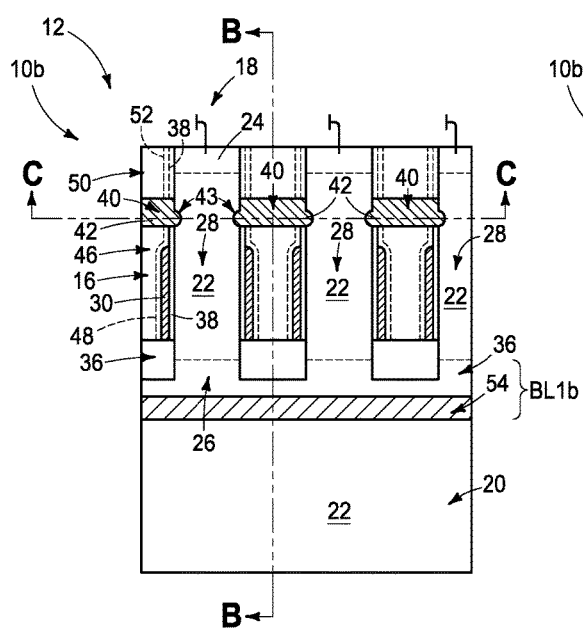
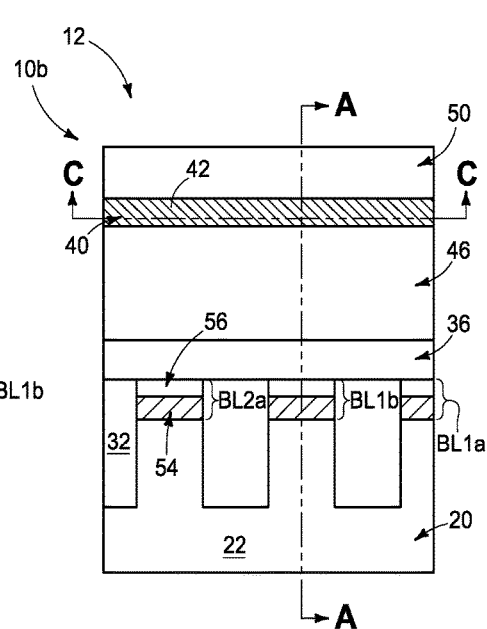
FIG. 3A      FIG. 3B

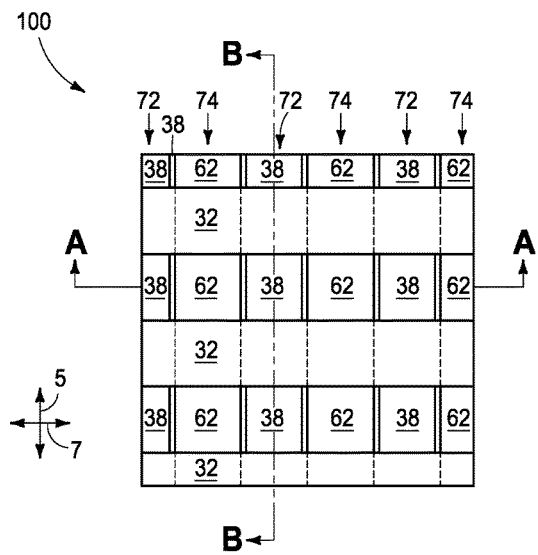
FIG. 9
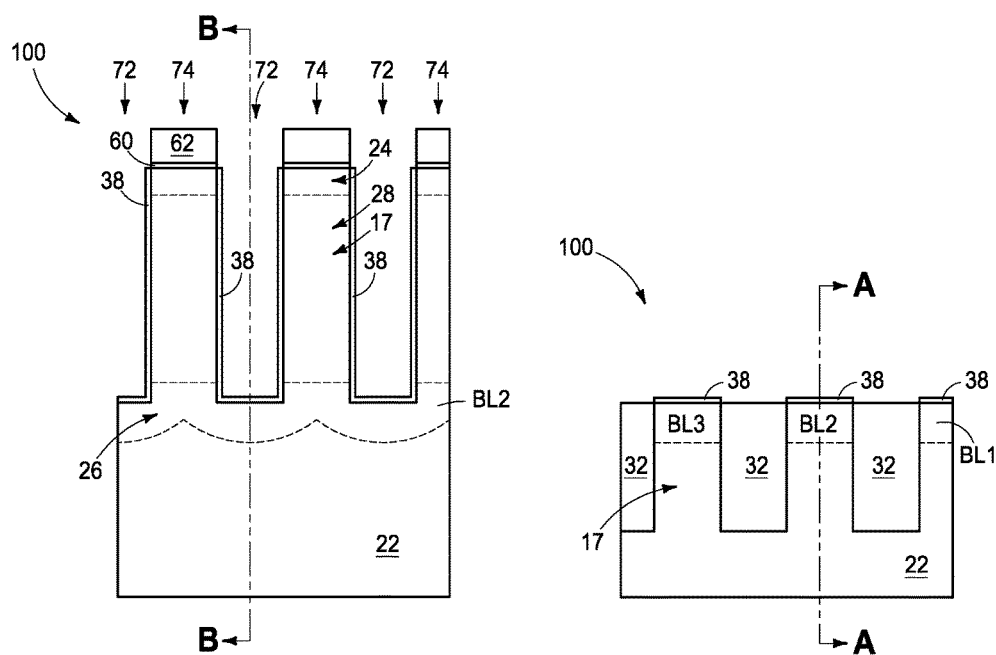
FIG. 9A  FIG. 9B

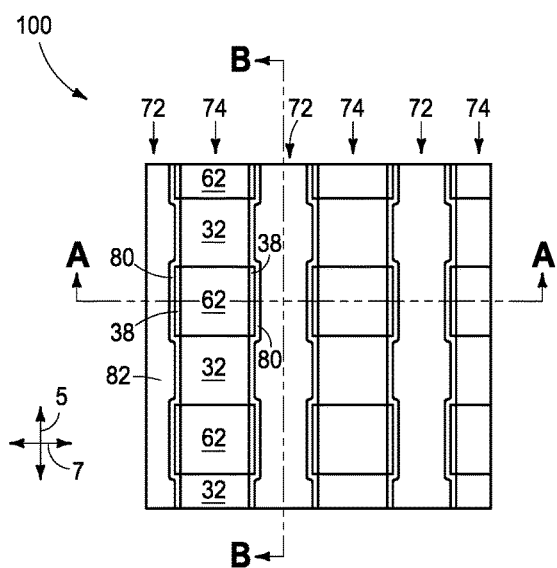
FIG. 13
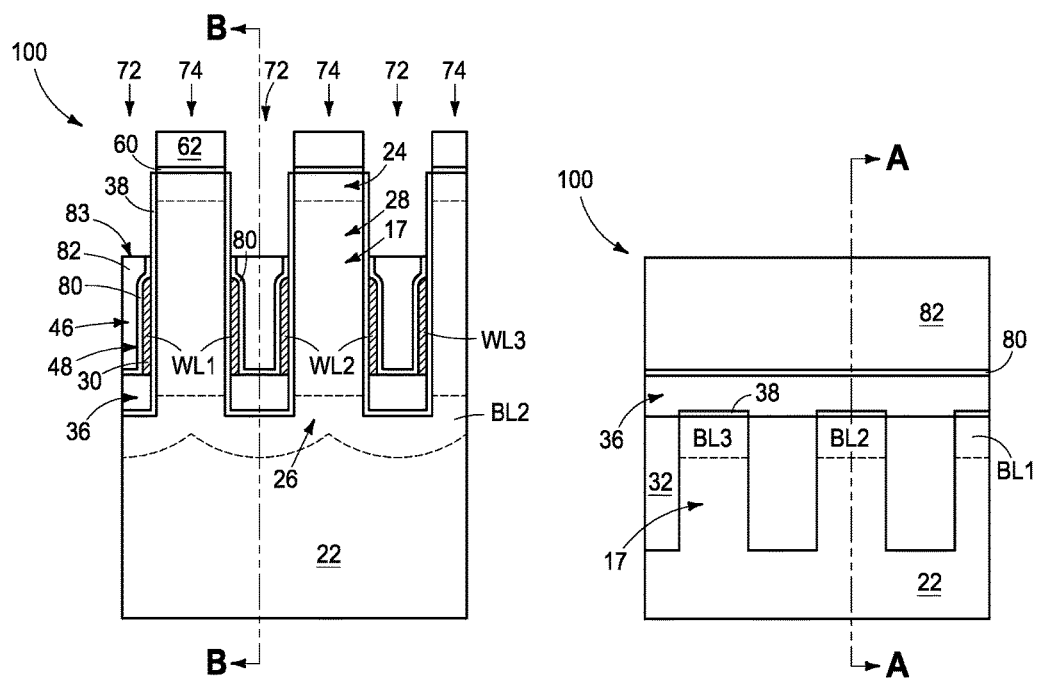
FIG. 13A
FIG. 13B

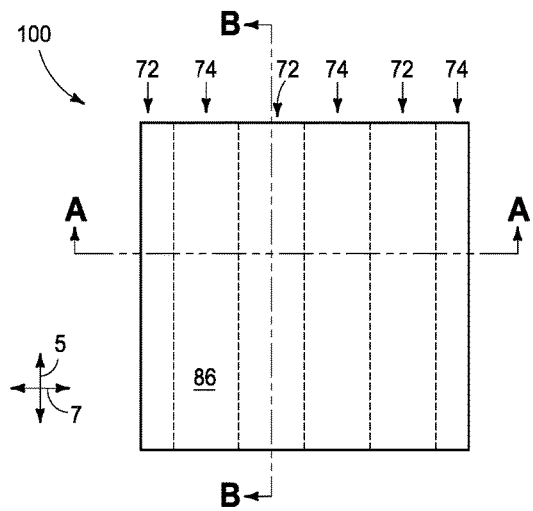
FIG. 14
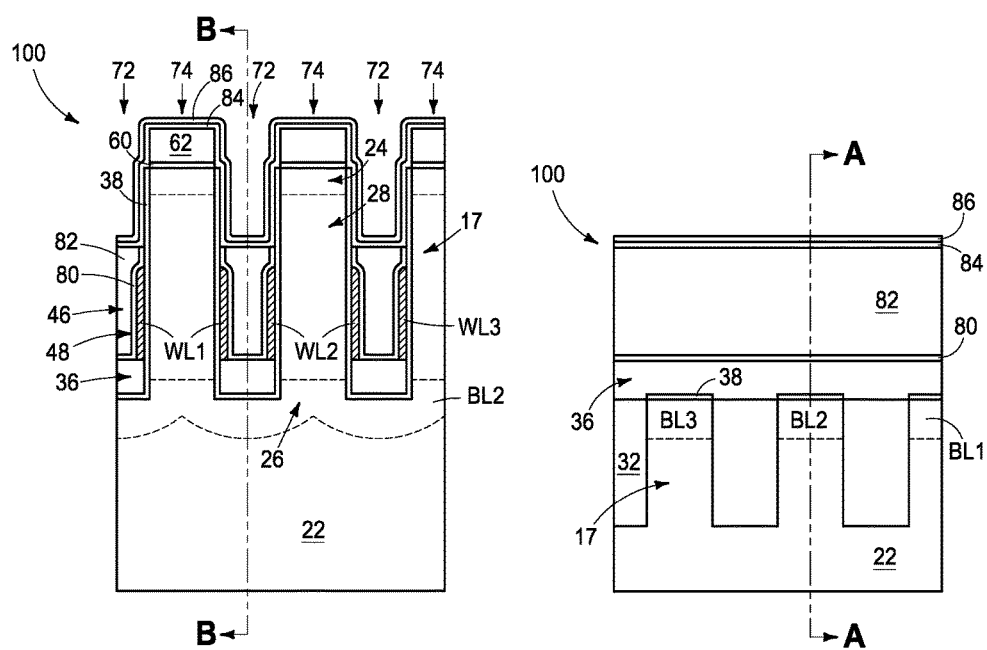
FIG. 14A   FIG. 14B

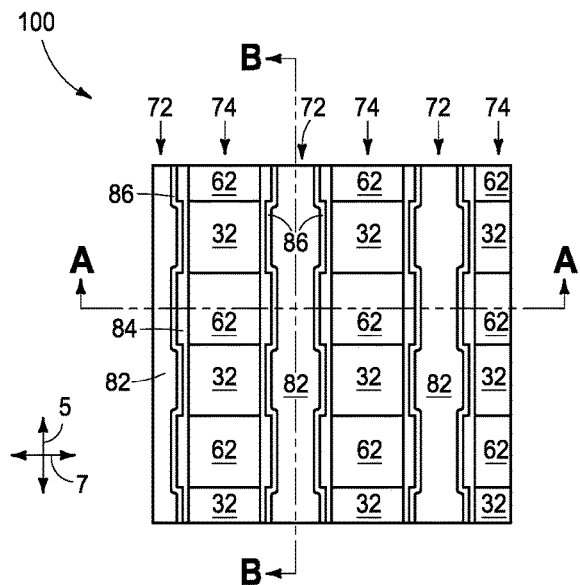
FIG. 16
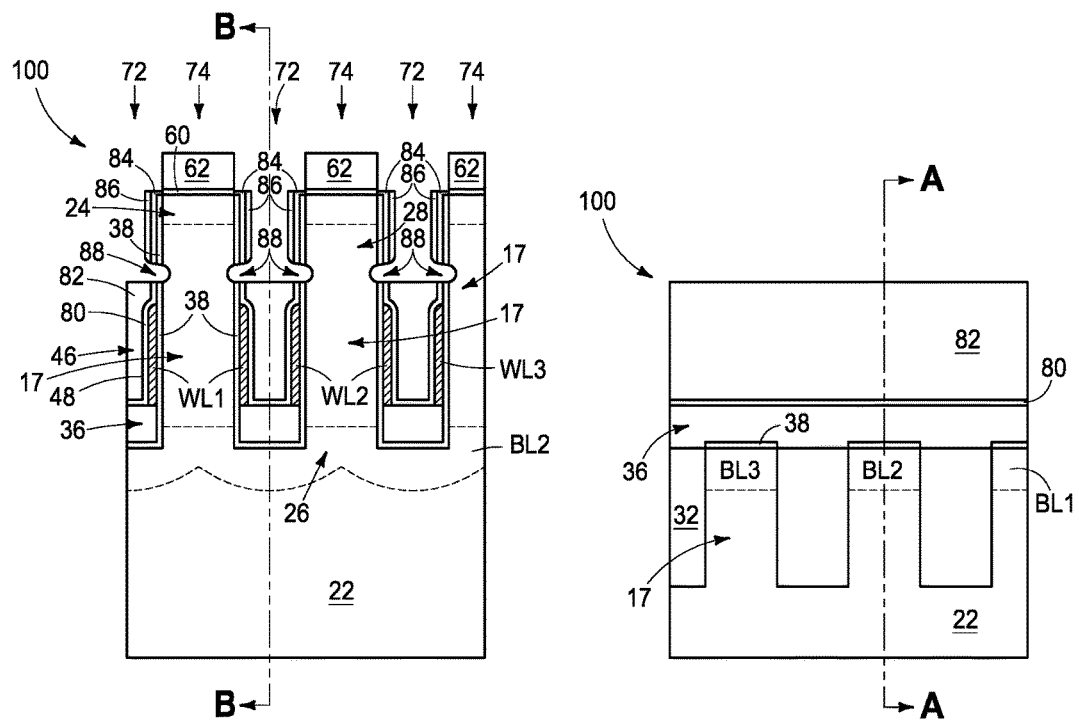
FIG. 16A  FIG. 16B

APPARATUSES HAVING BODY CONNECTION LINES COUPLED WITH ACCESS DEVICES

RELATED PATENT DATA

This application claims priority to U.S. provisional application Ser. No. 62/525,106, which was filed Jun. 26, 2017.

TECHNICAL FIELD

Apparatuses having body connection lines coupled with access devices.

BACKGROUND

Integrated memory may be configured as an array of memory cells. Each memory cell may include an access transistor in combination with a programmable device. For instance, an example memory cell may comprise an access transistor in combination with a capacitor (a so-called 1T1C memory cell), may comprise two access transistors in combination with a capacitor (a so-called 2T1C memory cell), etc.

In some applications, the access transistors may be vertical devices, and may comprise a channel region vertically between a pair of source/drain regions. Such vertical devices may advantageously occupy a smaller footprint as compared to other configurations (e.g., planar transistor devices), which may enable tighter packing and higher levels of integration. Floating body effects may problematically occur with vertical access transistors; as described in U.S. Pat. No. 8,878,271, with Kamal M. Karda as the first inventor, and which is assigned to Micron Technology, Inc. The floating body effects result from the channel region of a vertical access transistor being within a body of semiconductor material which is not electrically coupled with a reference voltage (i.e., which "floats" rather than being set to a specific reference voltage). The floating body effects may lead to degraded charge retention, power distribution problems, and/or other problems across a memory array.

It would be desirable to develop architectures which alleviate floating body effects associated with vertical access devices, and to develop methods for fabricating such architectures.

BRIEF DESCRIPTION OF THE DRAWINGS

FIG. 1A is also along the lines A-A of FIGS. 1B and 1C; and FIG. 1B is also along the lines B-B of FIGS. 1A and 1C.

FIG. 2A is also along the lines A-A of FIGS. 2B and 2C; and FIG. 2B is also along the lines B-B of FIGS. 2A and 2C.

FIG. 3 is a diagrammatic top view of an example memory array. FIGS. 3A and 3B are diagrammatic cross-sectional side views along the lines A-A and B-B, respectively, of FIG. 3. FIG. 3C is a diagrammatic cross-sectional view along the lines C-C of FIGS. 3A and 3B. FIG. 3A is also along the lines A-A of FIGS. 3B and 3C; and FIG. 3B is also along the lines B-B of FIGS. 3A and 3C.

FIGS. 4-19 are diagrammatic top views of an example construction at example processing stages of an example fabrication sequence which may be utilized for fabricating an example memory array. FIGS. 4A-19A and 4B-19B are diagrammatic cross-sectional side views along the lines A-A and B-B, respectively, of FIGS. 4-19. FIGS. 4A-19A are also along the lines A-A of FIGS. 4B-19B, and FIGS. 4B-19B are also along the lines B-B of FIGS. 4A-19A.

DETAILED DESCRIPTION OF THE ILLUSTRATED EMBODIMENTS

Some embodiments include apparatuses in which body regions of vertical access devices are electrically coupled to a reference voltage through body connection lines. The vertical access devices may comprise vertically-extending pillars of semiconductor material, and the body connection lines may directly contact the semiconductor material within the vertically-extending pillars. The body connection lines may comprise a different composition than the semiconductor material within the vertically-extending pillars. For instance, the body connection lines may comprise polycrystalline silicon while the semiconductor material within the vertically-extending pillars comprises monocrystalline silicon. In some applications, the body connection lines may have lateral edges that penetrate into the semiconductor material of the vertically-extending pillars. Example embodiments are described with reference to FIGS. 1-19.

Figure 1:
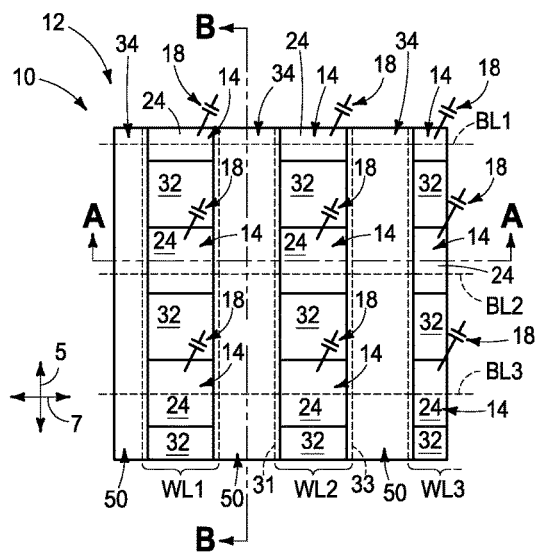
FIG. 1 is a diagrammatic top view of an example memory array.
Figure 1C:
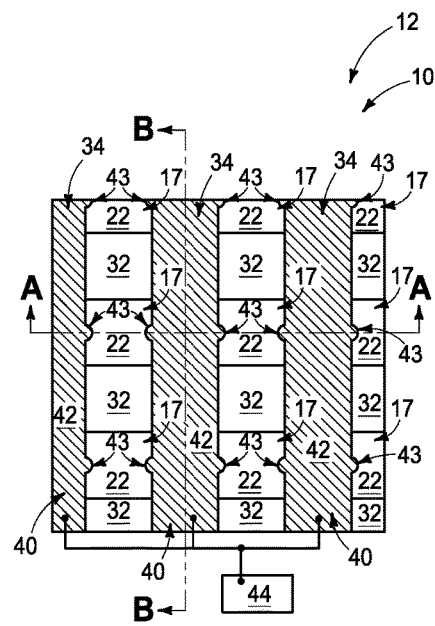
FIG. 1C is a diagrammatic cross-sectional view along the lines C-C of FIGS. 1A and 1B.

Referring to FIGS. 1-1C, a construction (i.e. apparatus) 10 includes a memory array 12 having a plurality of memory cells 14. The array 12 comprises rows along a direction of an axis 5, and columns along a direction of an axis 7. Wordlines WL1, WL2 and WL3 extend along the rows of the memory array, and digit lines (bitlines) BL1, BL2 and BL3 extend along the columns of the memory. The wordlines and digit lines are illustrated in dashed-line (i.e. phantom) view in FIG. 1 to indicate that they are beneath other materials.

Each memory cell 14 includes an access transistor 16 (labeled in FIG. 1A) and a programmable device 18. In the illustrated embodiment, the programmable devices 18 are charge-storage devices (specifically, capacitors), but in other embodiments may be any suitable devices which may store data.

The transistors 16 are each associated with a vertically-extending semiconductor pillar 17, with the pillars 17 extending upwardly from a base 20 of semiconductor material 22. The semiconductor material 22 may comprise any suitable semiconductor material, and in some embodiments may comprise, consist essentially of, or consist of monocrystalline silicon. The pillars 17 correspond to projections of the semiconductor material 22 extending upwardly from the base 20.

The pillars 17 and associated access transistors 16 are arranged in the array 12 comprising the rows along axis 5, and the columns along axis 7.

Figure 1A:
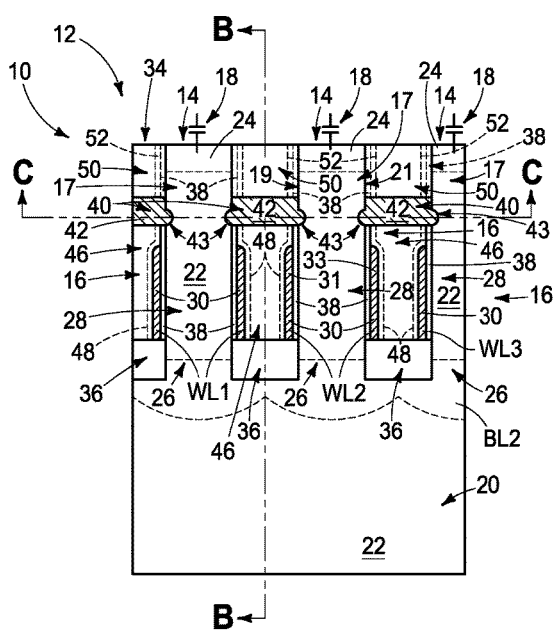
FIGS. 1A and 1B are diagrammatic cross-sectional side views along the lines A-A and B-B, respectively, of FIG. 1.

Each of the transistors 16 comprises an upper source/drain region 24 within a pillar 17, a lower source/drain region 26 within the pillar 17, and a channel region 28 between the upper source/drain region 24 and the lower source/drain region 26. Approximate boundaries of the source/drain regions 24/26 are diagrammatically illustrated with dashed lines. In the shown embodiment, the lower source/drain regions 26 merge with digit lines, as shown in FIG. 1A where the lower source/drain regions 26 merge with the digit line BL2.

The access transistors 16 comprise gates 30 along the channel regions 28. In the illustrated embodiment, the pillars 17 have two opposing sidewalls along the cross-section of FIG. 1A, as illustrated relative to the central pillar 17. Such central pillar has a first sidewall 19 and a second sidewall 21 in opposing relation to the first sidewall. A gate 30 has a first portion 31 along the first sidewall, and a second portion 33 along the second sidewall. The first and second portions are electrically coupled to one another at a location outside of the illustrated cross-section, and are together operated as a single gate. Such is diagrammatically illustrated in FIG. 1A by having the first and second portions 31 and 33 coupled to the same wordline WL2. In some embodiments, the wordlines may be considered to comprise gates of the access transistors 16, and in the illustrated embodiment the gates 30 are shown to be comprised by regions of the wordlines WL1, WL2 and WL3. The wordline WL2 may be considered to comprise a first portion comprising the first gate portion 31, and to comprise a second portion comprising the second gate portion 33.

The wordlines and associated gates 30 may comprise any suitable conductive material(s); such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

Figure 1B:
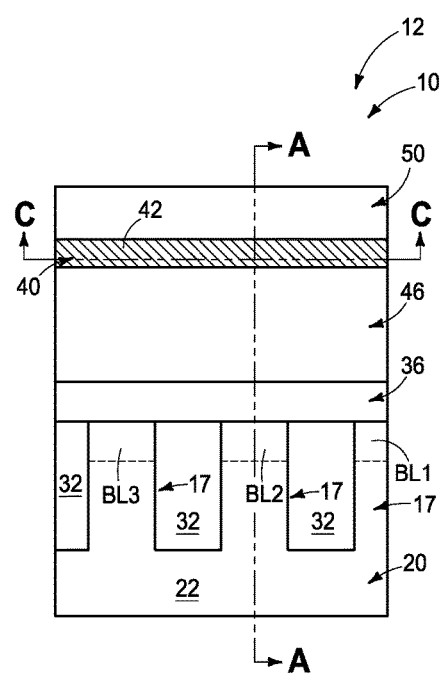

The digit lines BL1, BL2 and BL3 are coupled with the lower source/drain regions 26 of the access transistors, and extend along bottom regions of the pillars 17; with FIG. 1B showing the digit lines extending along bottom regions of the pillars 17.

The programmable devices 18 are electrically coupled with the upper source/drain regions 24 of the access transistors 16. In the illustrated embodiment, the programmable devices 18 are capacitors having lower nodes coupled with the source/drain regions 24.

The pillars 17 are spaced from one another by insulative material 32 along the row direction of axis 5. The insulative material 32 may comprise any suitable composition or combination of compositions; and in some embodiments may comprise, consist essentially of, or consist of silicon dioxide.

Intervening rows 34 extend along the direction of axis 5 and separate the pillars 17 along the column direction of axis 7. The rows 34 include insulative steps 36 beneath the wordlines WL1, WL2 and WL3. The steps 36 may comprise any suitable insulative composition or combination of compositions; and in some embodiments may comprise, consist essentially of, or consist of silicon dioxide.

Dielectric material 38 is provided between the gates 30 and the semiconductor material 22 of pillars 17. The dielectric material 38 may be referred to as gate dielectric, and may comprise any suitable composition or combination of compositions; and in some embodiments may comprise, consist essentially of, or consist of silicon dioxide.

Body connection lines 40 are over the wordlines WL1, WL2 and WL3, and extend parallel to the wordlines. The body connection lines 40 comprise electrically conductive material 42, which may be any suitable composition(s). In some embodiments, material 42 comprises conductively-doped silicon (for instance, n-type doped silicon or p-type doped silicon). The body connection lines 40 may comprise a different composition than the semiconductor material 22 of the pillars 17. For instance, in some embodiments the semiconductor material 22 comprises, consists essentially of, or consists of monocrystalline silicon; and the conductive material 42 of the body connection lines 40 comprises, consists essentially of, or consists of polycrystalline silicon.

The body connection lines 40 directly contact body regions of the access transistors 16 within the pillars 17. In the illustrated embodiment, the body connection lines 42 have lateral edges 43 that penetrate into the pillars 17.

The body connection lines 40 may all be coupled with a common reference voltage 44, as is diagrammatically illustrated in FIG. 1C. Alternatively, the body connection lines may be grouped into a plurality of subgroups, with each subgroup being configured to receive a voltage independent of voltage applied to a different subgroup. In the embodiment of FIG. 1C, the reference voltage 44 may be any suitable reference voltage, including, for example, a ground voltage, a common plate voltage, etc.

It is noted that each of the gate portions 31 and 33 is under a separate body connection line. In some embodiments, the body connection line over the gate portion 31 may be referred to as a first body connection line having a lateral edge 43 that extends into the first sidewall 19 of the pillar 17 between gate portions 31 and 33, and the body connection line over the gate portion 33 may be referred to as a second body connection line having a lateral edge 43 that extends into the second sidewall 21 of such pillar. Is also noted that each body connection line 40 is over portions of two separate wordlines. For instance, the central body connection line 40 of FIG. 1A is over a portion of the wordline WL1 and a portion of the wordline WL2. In some embodiments, such body connection line 40 may be considered to be over a first portion of one wordline (with said one wordline being WL1) and to be over a second portion of a second wordline adjacent said one wordline (with said second wordline being WL2).

Insulative regions 46 are beneath the body connection lines 40. The insulative regions 46 may comprise any suitable composition or combination of compositions; including, for example, one or more of silicon nitride, silicon dioxide, etc. In some embodiments, nitride liners 48 (shown in FIG. 1A) are provided along the dielectric material 38 and wordlines WL1, WL2 and WL3. The nitride liners 48 are illustrated with dashed lines in FIG. 1A to indicate that they may be optional in some embodiments. The nitride liners 48 may comprise any suitable composition, and in some embodiments may comprise, consist essentially of, or consist of silicon nitride. The nitride liners 48 within insulative regions 46 may be referred to as lower nitride liners as they are beneath the body connection lines 40. Such lower nitride liners 48 may directly contact bottom surfaces of the body connection lines 40.

Insulative regions 50 are over the body connection lines 40. The insulative regions 50 may comprise any suitable composition or combination of compositions; including, for example, one or more of silicon nitride, silicon dioxide, etc. In some embodiments, the dielectric material 38 extends along sidewalls of the pillars 17 within the insulative regions 50; and nitride liners 52 are provided along the dielectric material 38 and accordingly along the pillars 17. The nitride liners 52 and dielectric material 38 within insulative regions 50 are shown in FIG. 1A and are illustrated with dashed lines to indicate that they may be optional in some embodiments. The nitride liners 52 may comprise any suitable composition; and in some embodiments may comprise, consist essentially of, or consist of silicon nitride. The nitride liners 52 may be referred to as upper nitride liners as they are above the body connection lines 40. Such upper nitride liners 52 may directly contact upper surfaces of the body connection lines 40.

Figure 2:
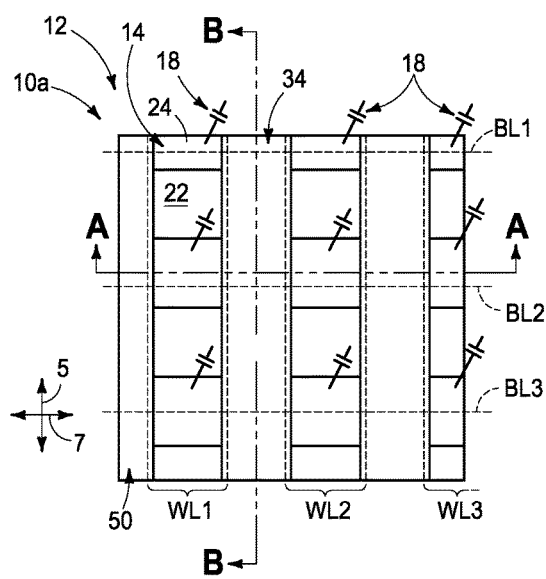
FIG. 2 is a diagrammatic top view of an example memory array.
Figure 2C:
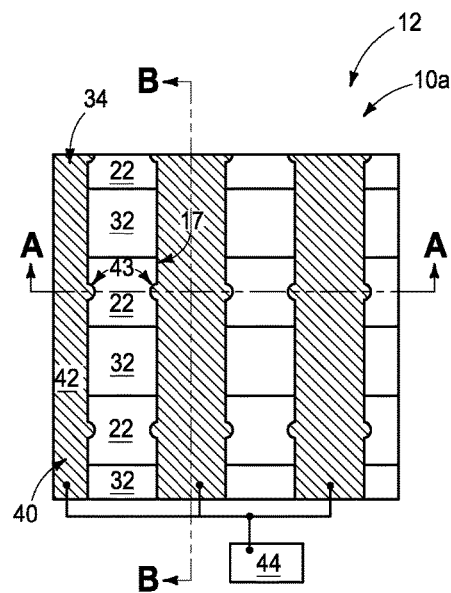
FIG. 2C is a diagrammatic cross-sectional view along the lines C-C of FIGS. 2A and 2B.
Figure 2A:
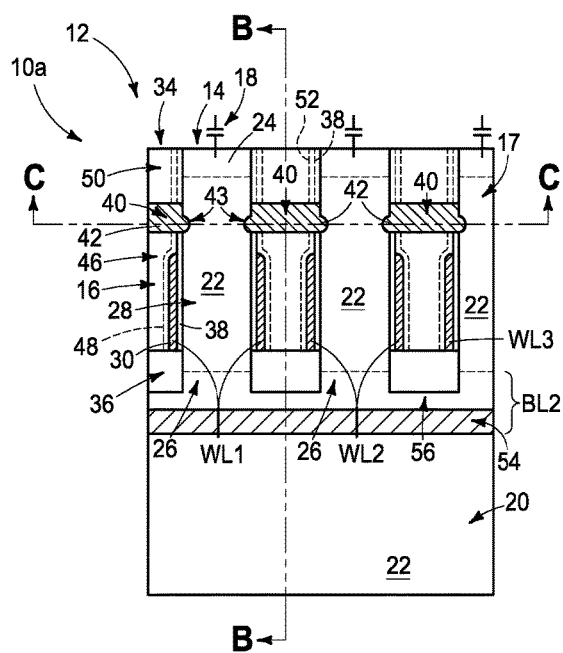
FIGS. 2A and 2B are diagrammatic cross-sectional side views along the lines A-A and B-B, respectively, of FIG. 2.
Figure 2B:
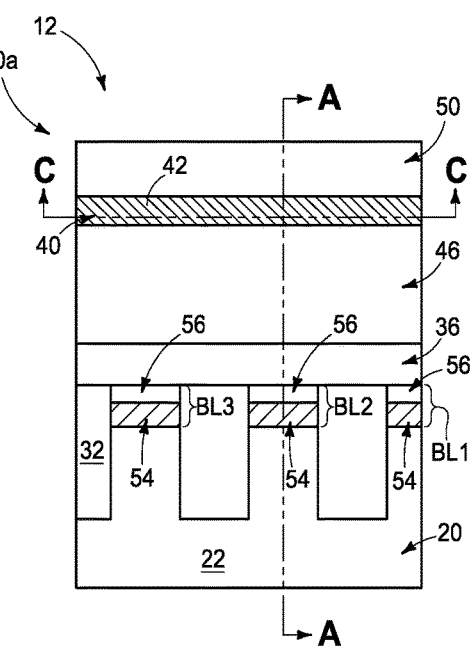

The embodiment of FIGS. 1-1C shows digit lines BL1, BL2 and BL3 comprising conductively-doped regions extending along columns of the array 12. In other embodiments, the digit lines may have other configurations. For instance, FIGS. 2-2C show a construction 10a similar to the construction 10 discussed above relative to FIGS. 1-1C, but in which the digit lines comprise metal-containing lines 54 extending along the columns of axis 7. In the illustrated embodiment, the digit lines include a conductively-doped region 56 merging with the lower source/drain regions 26, in combination with the metal-containing line 54. In other embodiments, the digit lines may only include the metal-containing line 54, with such line being directly against the source/drain regions 26.

The embodiments of FIGS. 1-1C and 2-2C pertain to memory cells in which capacitors 18 are in one-to-one correspondence with the access transistors; or in other words pertain to one-transistor-one capacitor (1T1C) memory cells. In other applications, other types of memory cells may be fabricated. For instance, FIGS. 3-3C show a construction 10b similar to the construction 10a discussed above relative to FIGS. 2-2C, but in which the memory cells are two-transistor-one-capacitor (2T1C) memory cells. Specifically, each capacitor 18 bridges across two access transistors 16, and the digit lines are replaced with comparative bitlines BL1a, BL1b and BL2a arranged in paired sets. For instance, the comparative bitlines BL1a and BL1b are a paired set, and extend to a sense amplifier (SA) which compares electrical properties of the comparative bitline BL1a with those of the comparative bitline BL1b.

The architectures described above with reference to FIGS. 1-1C, 2-2C and 3-3C may be formed with any suitable processing. For instance, FIGS. 4-19 describe example processing which may be utilized to form an architecture of the type shown in FIGS. 1-1C.

Figure 4:
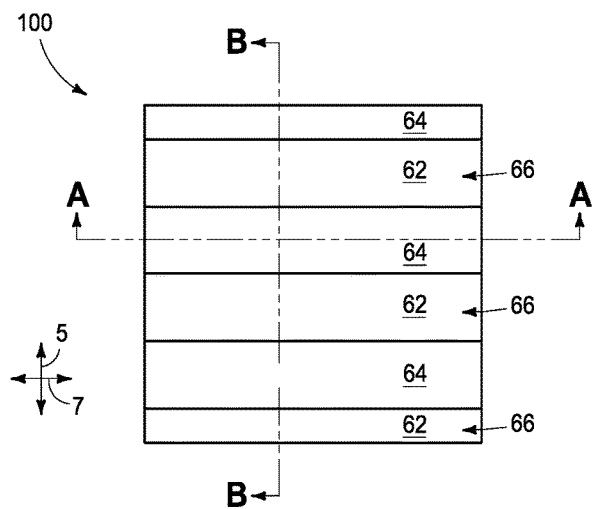
Figure 4A:
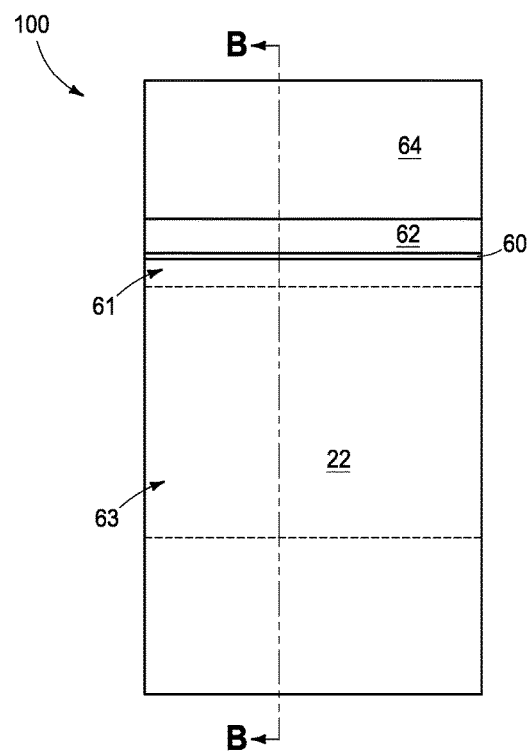
Figure 4B:
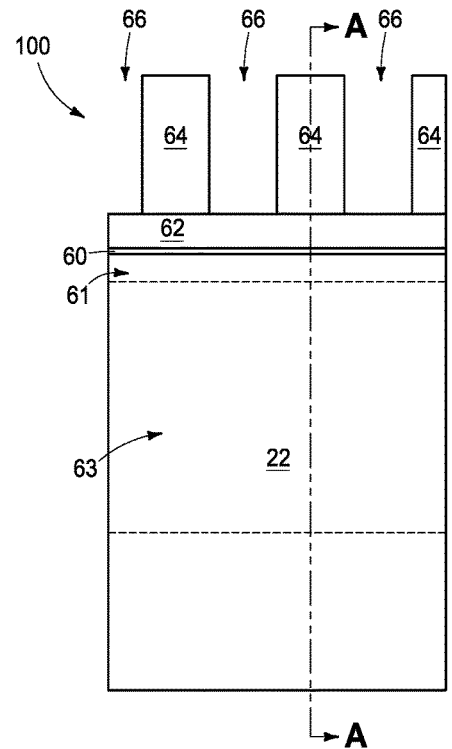

Referring to FIGS. 4-4B, a construction 100 comprises semiconductor material 22 having a pad oxide 60 and a hardmask 62 thereover. The pad oxide 60 may comprise any suitable composition(s); and in some embodiments may comprise, consist essentially of, or consist of silicon dioxide. The hardmask 62 may comprise any suitable composition(s); and in some embodiments may comprise, consist essentially of, or consist of a composition comprising silicon, nitrogen and carbon.

A patterned masking material 64 is over the hardmask 62. The masking material 64 may comprise any suitable composition or combination of compositions; and in some embodiments may comprise photolithographically-patterned photoresist. The masking material 64 has trenches 66 extending therethrough, with such trenches extending along the column direction of axis 7.

The semiconductor material 22 may have dopant provided therein to form a doped region 61. An approximate lower boundary of the doped region 61 is indicated with a dashed line. The doped region 61 may be patterned into the upper source/drain regions 24 described above with reference to FIGS. 1-1C, and accordingly may comprise suitable dopant for utilization in such source/drain regions. Also, in some embodiments a doped region 63 may be provided within the semiconductor material 22 beneath the doped region 61, and may be appropriately-doped to be incorporated into the channel regions 28 described above with reference to FIGS. 1-1C. An approximate lower boundary of the doped region 63 is indicated with a dashed line.

Figure 5:
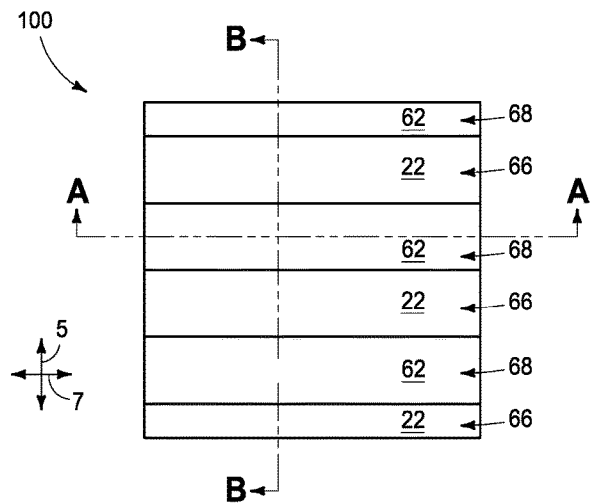
Figure 5A:
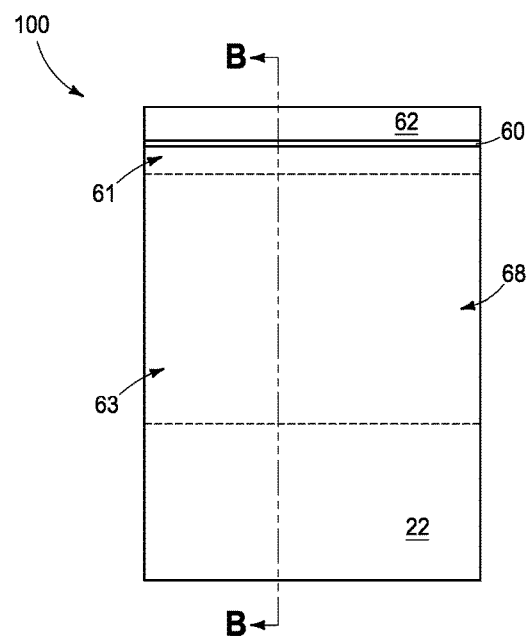
Figure 5B:
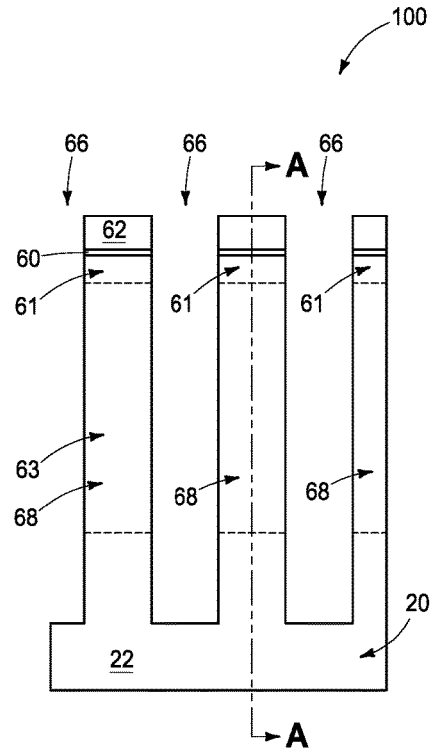

Referring to FIGS. 5-5B, the trenches 66 are extended through materials 60 and 62, and into the semiconductor material 22 to pattern the semiconductor material into a base 20 having rails 68 extending upwardly therefrom. The rails 68 extend along the column direction of axis 7, and are spaced from one another by trenches 66.

Figure 6:
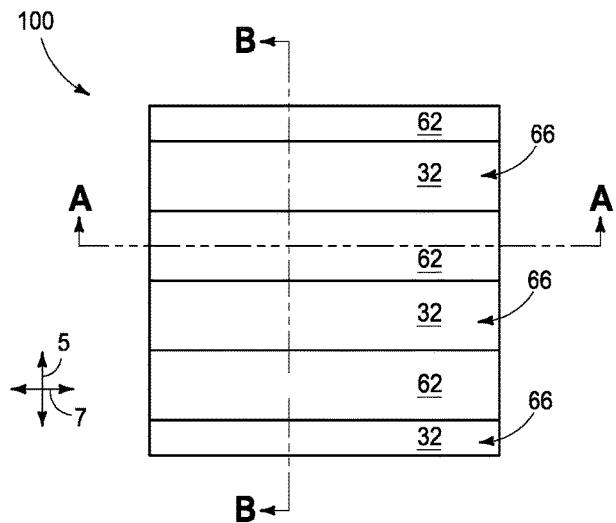
Figure 6A:
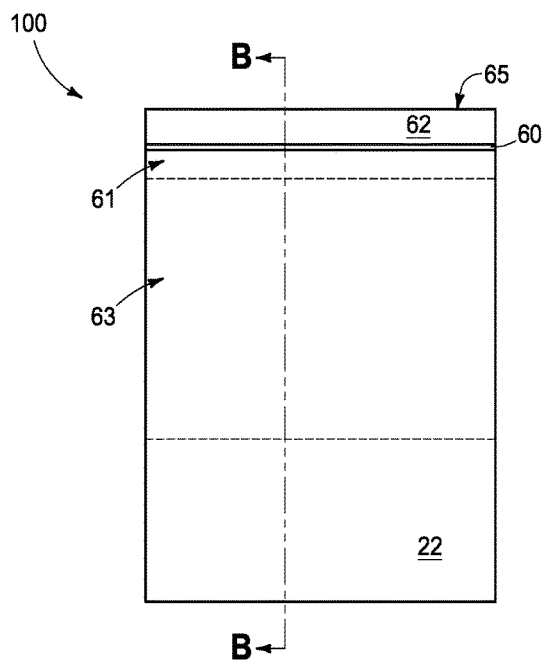
Figure 6B:
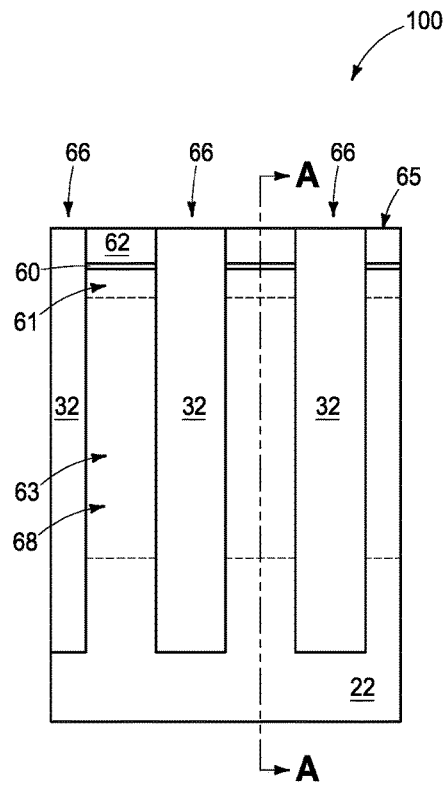

Referring to FIGS. 6-6B, insulative material 32 is formed within the trenches 66. The insulative material 32 may correspond to, for example, spin-on dielectric (SOD); and in some embodiments may comprise, consist essentially of, or consist of silicon oxide. In the illustrated embodiment, a planarized surface 65 extends across the hardmask 62 and the insulative material 32. Such planarized surface to be formed utilizing any suitable processing, including; for example, chemical-mechanical polishing (CMP).

Figure 7:
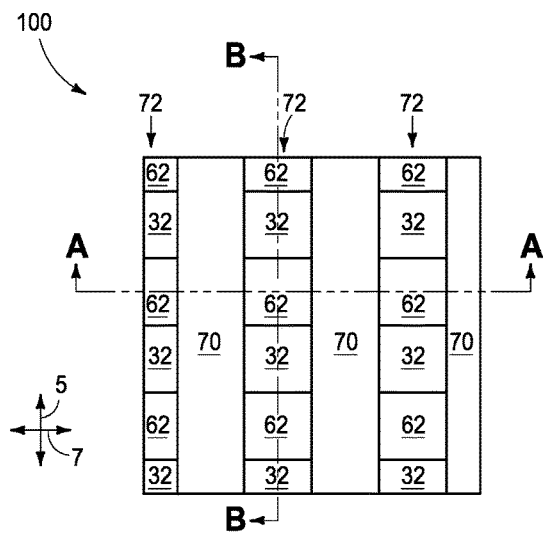
Figure 7A:
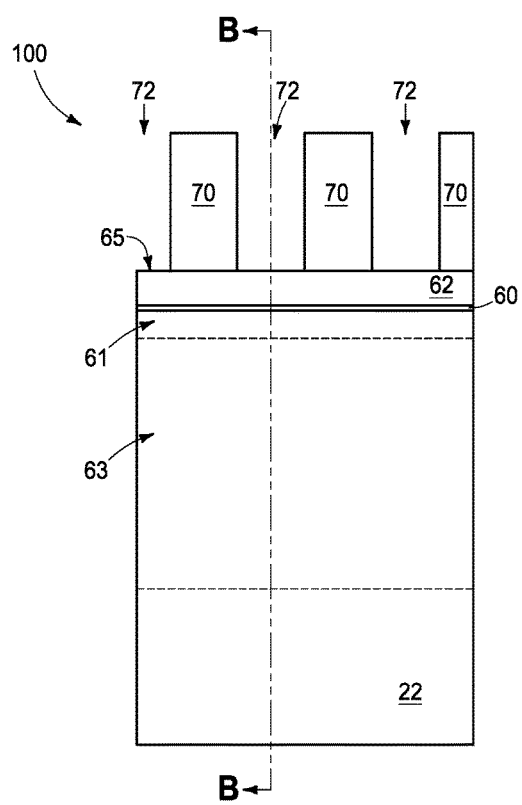
Figure 7B:
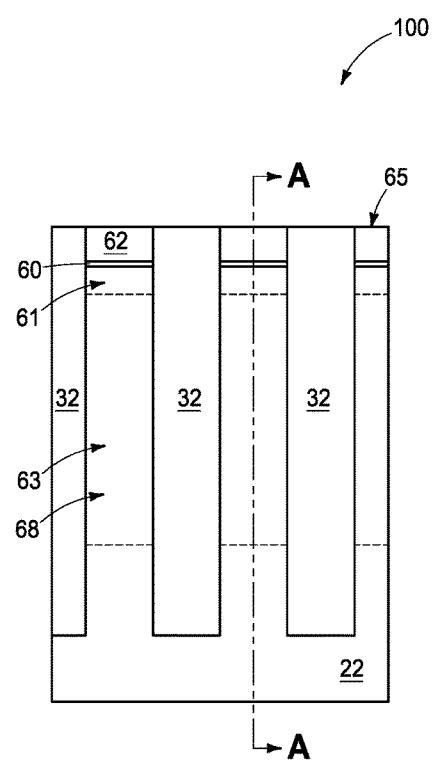

Referring to FIGS. 7-7B, patterned masking material 70 is formed over the planarized surface 65. The masking material 70 may comprise any suitable composition or combination of compositions; and in some embodiments may comprise photolithographically-patterned photoresist. The masking material 70 has trenches 72 extending therethrough, with such trenches extending along the row direction of axis 5.

Figure 8:
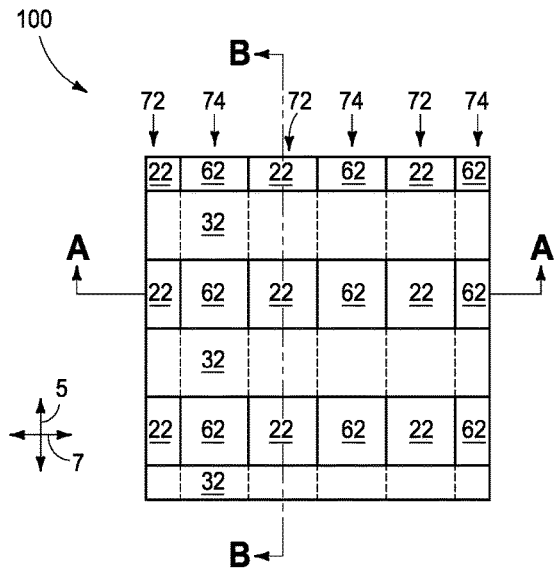
Figure 8A:
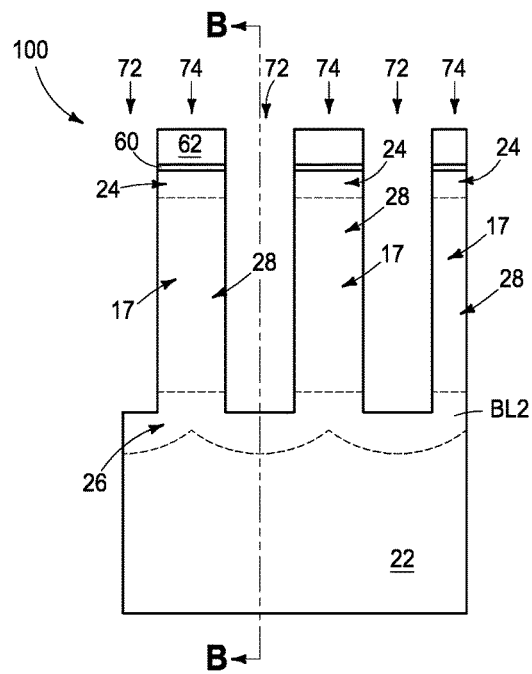
Figure 8B:
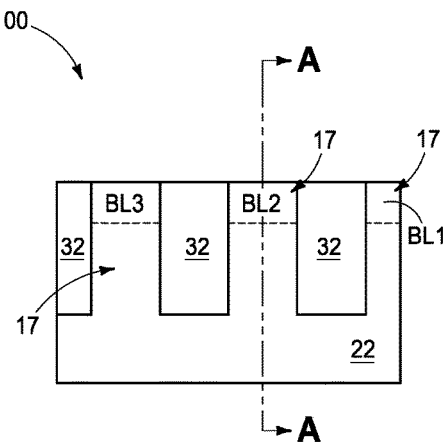

Referring to FIGS. 8-8B, the trenches 72 are extended through materials 60 and 62, and into the materials 22 and 32 to form rails 74 extending along the row direction of axis 5. The formation of rails 74 patterns the semiconductor material 22 into the pillars 17; with each rail 74 comprising pillars 17 of semiconductor material 22 alternating with regions of the insulative material 32. The formation of rails 74 also patterns the doped region 61 (FIGS. 7-7B) into the upper source/drain regions 24, and patterns the doped region 63 (FIGS. 7-7B) into channel regions 28.

Subsequently, dopant is implanted into the trenches 72 to form the lower source/drain regions 26 and the digit lines BL1, BL2 and BL3. Lower regions of the digit lines are diagrammatically indicated with dashed lines.

Referring to FIGS. 9-9B, gate dielectric material 38 is formed along exposed surfaces of semiconductor material 22. In some embodiments, the gate dielectric material 38 comprises silicon dioxide and is thermally grown from exposed surfaces of the silicon-containing material 22. Alternatively, or additionally, at least some of the gate dielectric material 38 may be formed utilizing other suitable methodologies; including, for example, one or more of atomic layer deposition (ALD), chemical vapor deposition (CVD), etc.

Figure 10:
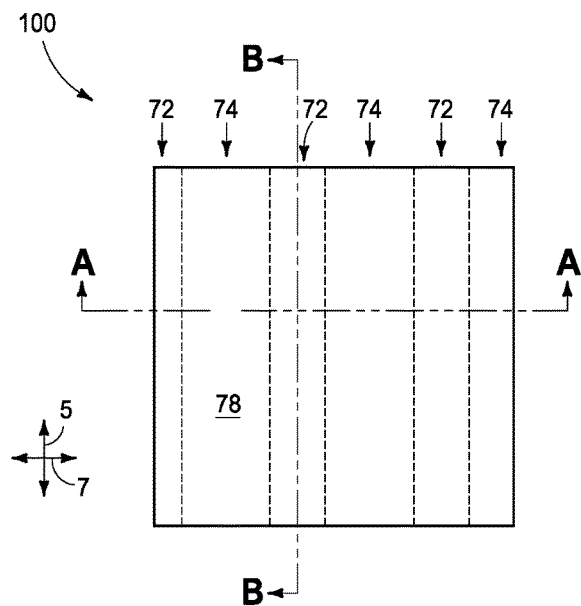
Figure 10A:
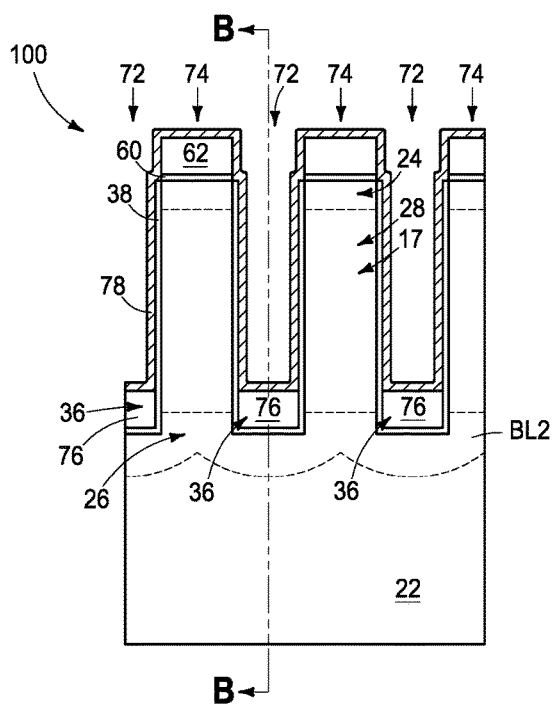
Figure 10B:
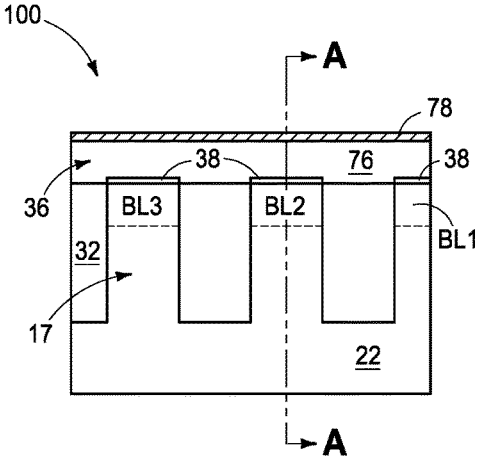

Referring to FIGS. 10-10B, insulative material 76 is provided along the bottoms of trenches 72 to form the insulative steps 36, and conductive material 78 is provided over such insulative steps. The insulative material 76 may comprise any suitable composition(s); and in some embodiments may comprise, consist essentially of, or consist of silicon dioxide. The conductive material 78 may comprise any suitable composition(s); such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

Figure 11:
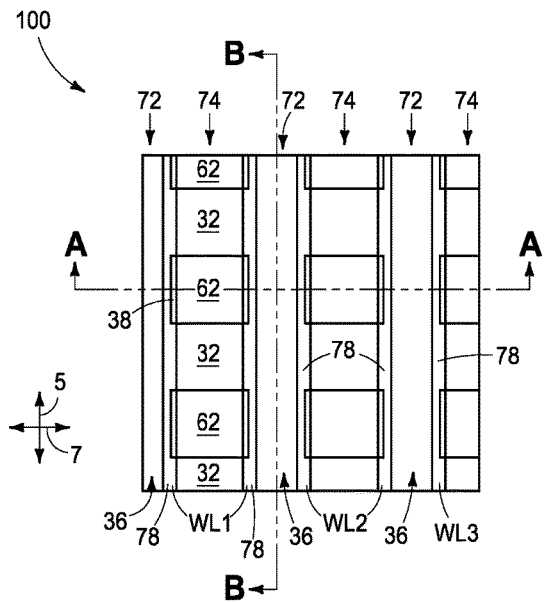
Figure 11A:
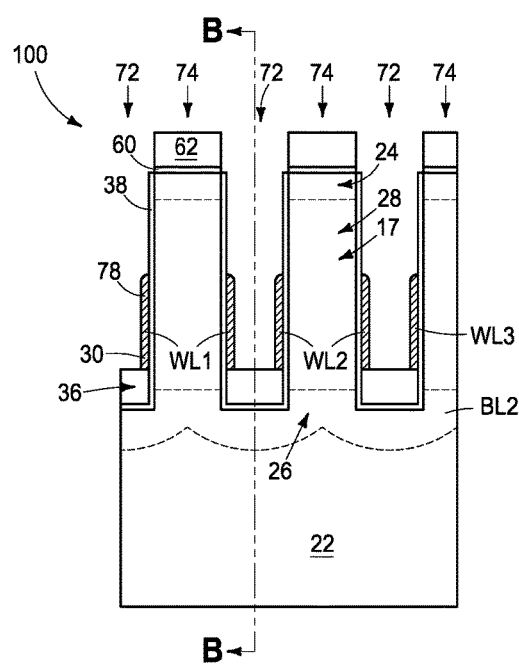
Figure 11B:
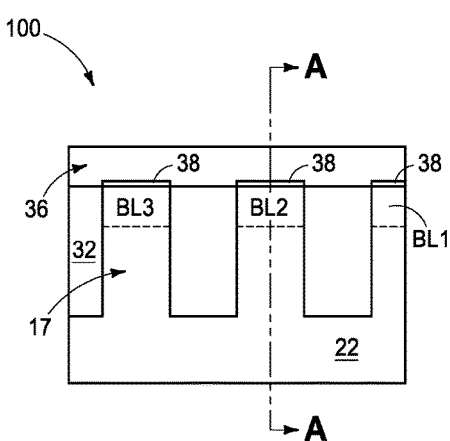

Referring to FIGS. 11-11B, the conductive material 78 is patterned into the wordlines WL1, WL2, WL3, and the associated transistor gates 30.

Figure 12:
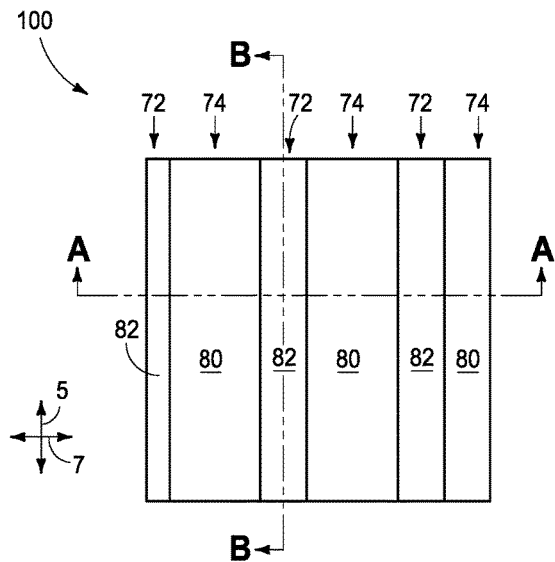
Figure 12A:
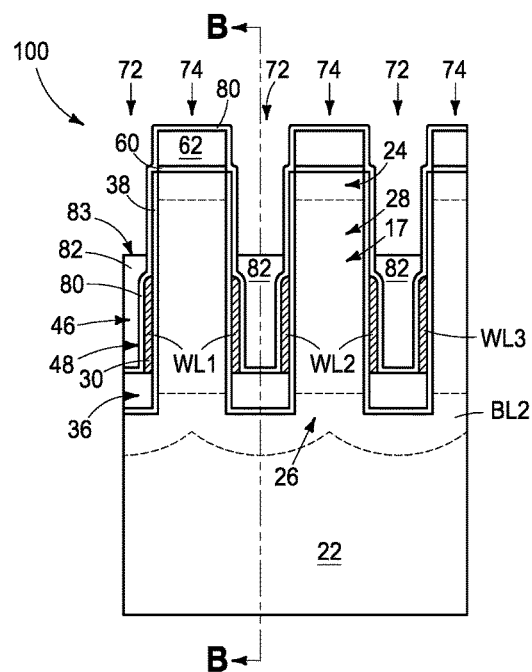
Figure 12B:
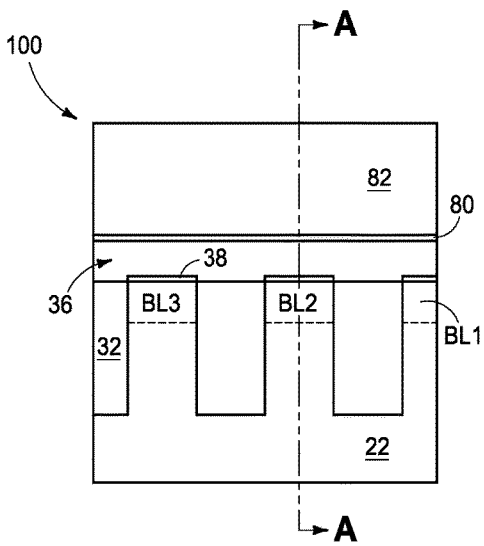

Referring to FIGS. 12-12B, nitrogen-containing material 80 is formed over the rails 74, and within the trenches 72 between the rails. The nitrogen-containing material 80 may comprise nitride; and in some embodiments may comprise, consist essentially of, or consist of silicon nitride.

Insulative material 82 is formed within the trenches 72. The insulative material 82 may comprise any suitable composition or combination of compositions; and in some embodiments may comprise, consist essentially of, or consist of silicon dioxide.

The insulative material 82 is recessed within the trenches 72 to have an upper surface 83 above the wordlines WL1 WL2 and WL3. The upper surface 83 may be set at any suitable level, and ultimately define locations of the body connection lines 40 described above with reference to FIGS. 1-1C.

The insulative material 82 and nitrogen-containing material 80 form insulative regions 46 of the type shown above with reference to FIGS. 1-1C.

Referring to FIGS. 13-13B, the nitrogen-containing material 80 is recessed to about the level of the upper surface 83 of insulative material 82 utilizing one or more suitable etches selective for the material 80 relative to the materials 62, 32, 38 and 82. For instance, in some embodiments material 80 consists of silicon nitride, material 62 comprises SiNC (where the formula indicates primary constituents rather than a specific stoichiometry), and materials 32, 38 and 82 consist of silicon dioxide; and accordingly material 80 may be selectively removed relative to the materials 32, 38, 62 and 82 with any etch selective for silicon nitride relative to silicon dioxide and SiNC. The nitrogen-containing material 80 remaining at the processing stage of FIGS. 13-13B is configured as the lower nitride liners 48 described above with reference to FIGS. 1-1C.

Referring to FIGS. 14-14B, insulative material 84 is formed over the rails 74 and within the trenches 72, and nitrogen-containing material 86 is formed over the insulative material 84.

The insulative material 84 may comprise any suitable composition or combination of compositions; and in some embodiments may comprise, consist essentially of, or consist of silicon dioxide.

The nitrogen-containing material 86 may comprise a same composition as the nitrogen-containing material 80; and in some embodiments may comprise, consist essentially of, or consist of silicon nitride.

Figure 15:
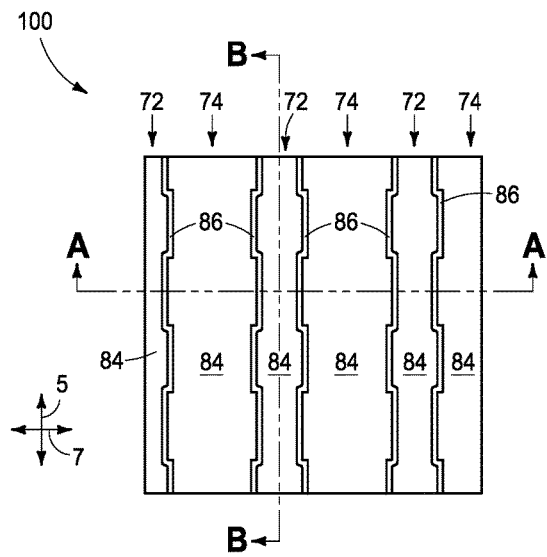
Figures 15A, 15B:
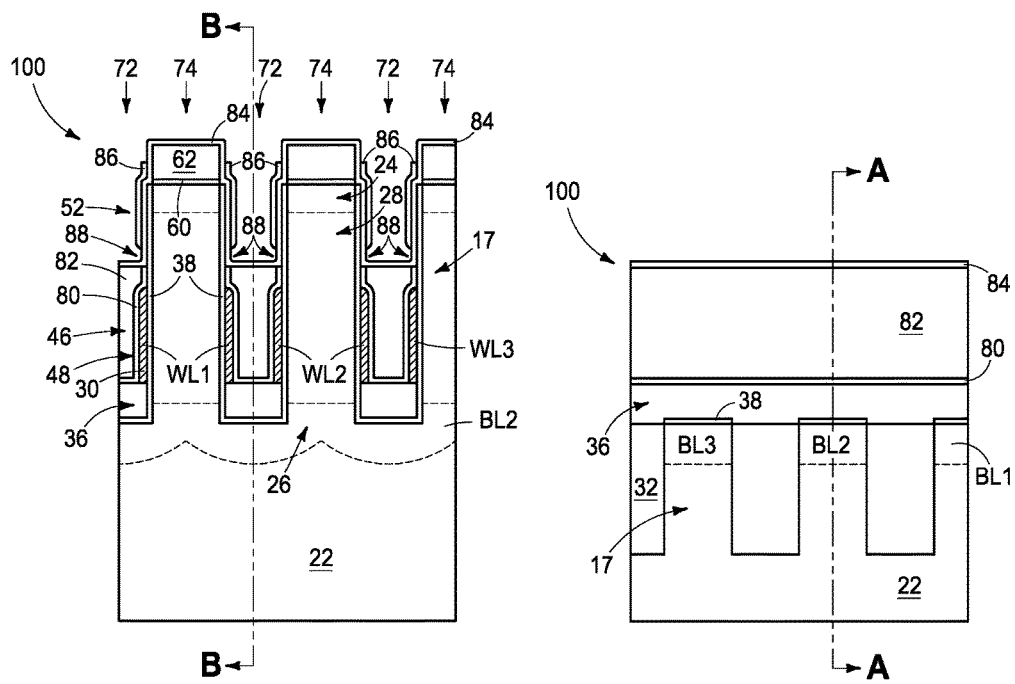

Referring to FIGS. 15-15B, the nitrogen-containing material 86 is etched with a "punch" etch which removes the material 86 from over horizontal surfaces, and forms gaps 88 extending under the material 86. The nitrogen-containing material 86 remaining at the processing stage of FIGS. 15-15B is configured as the upper nitride liners 52 described above with reference to FIGS. 1-1C.

Referring to FIGS. 16-16B, a vapor etch utilizing fluorine (and/or another suitable etch) is utilized to extend the gaps 88 into the semiconductor material 22 of the pillars 17. In the illustrated embodiment, such etching also removes some of the exposed oxide of other materials (for instance, removes the oxide 84 from over the hardmask 62).

Figure 17:
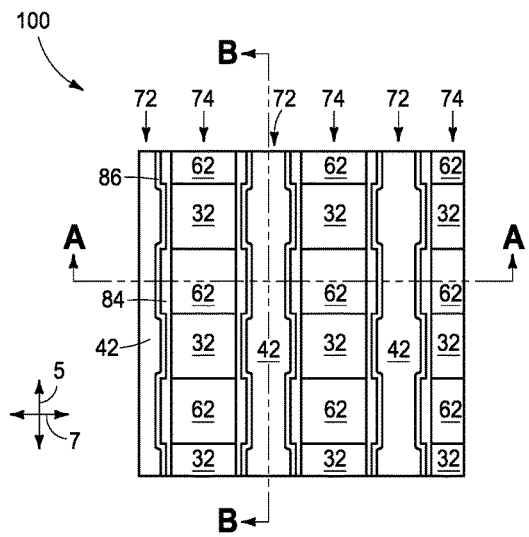
Figure 17A:
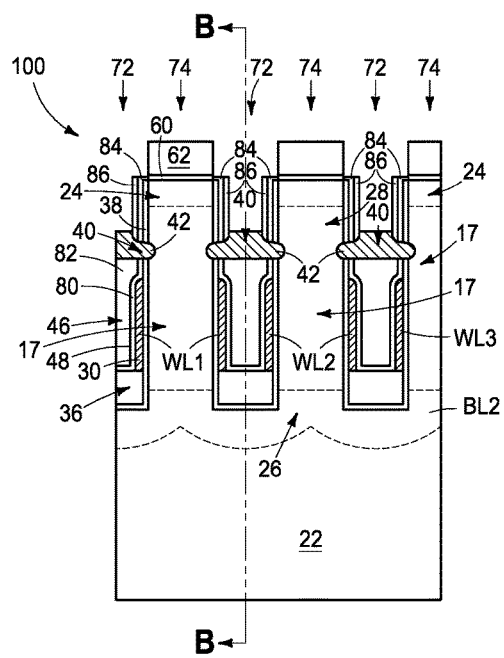
Figure 17B:
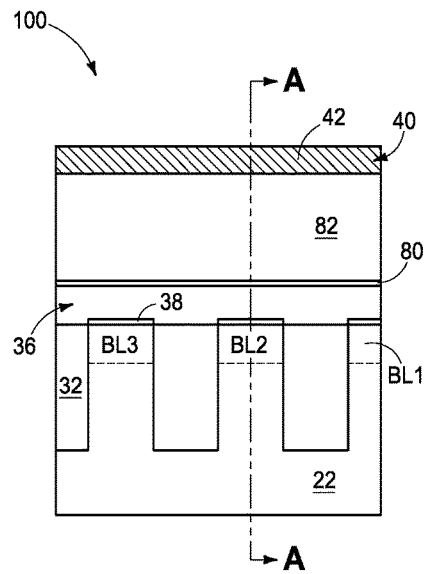

Referring to FIGS. 17-17B, conductive material 42 is provided within the trenches 72 and recessed to be at a desired height within the trenches 72. The conductive material 42 is configured as the body connection lines 40 described above with reference to FIGS. 1-1C; and in some embodiments may comprise, consist essentially of, or consist of appropriately-doped polycrystalline silicon (e.g., n-type doped polycrystalline silicon or p-type doped polycrystalline silicon). The body connection lines 40 may be coupled with a common reference voltage 44 of the type described in FIG. 1C (such common reference voltage is not shown in FIGS. 17-17B).

Figure 18:
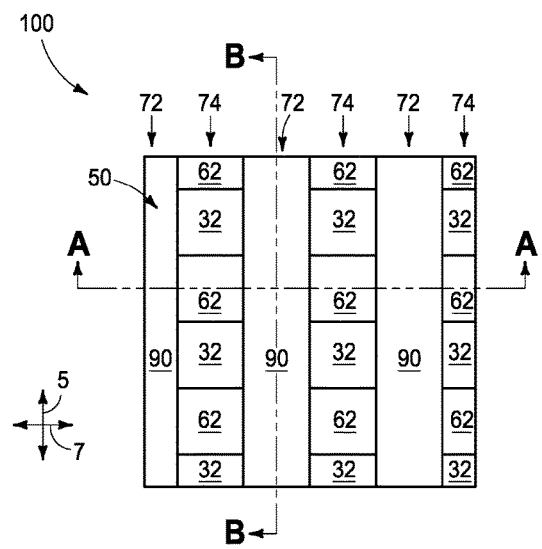
Figure 18A:
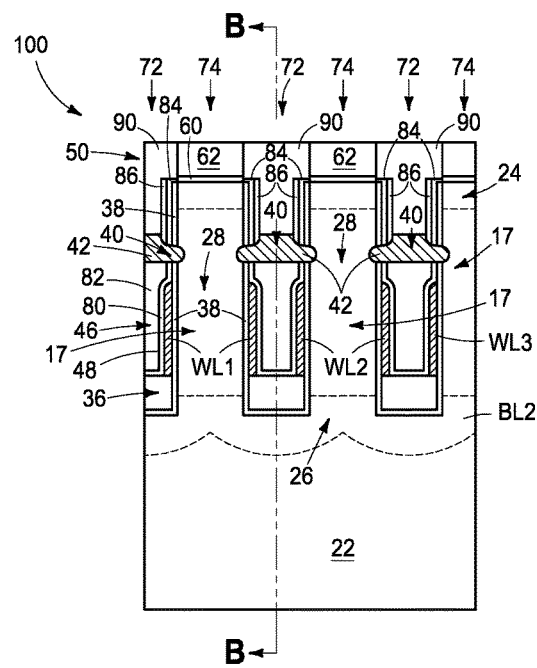
Figure 18B:
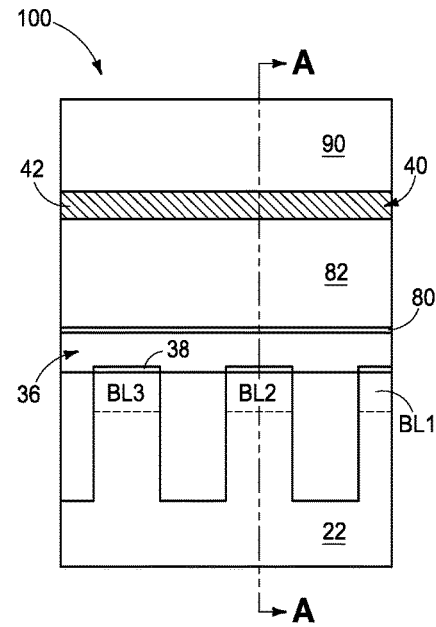

Referring to FIGS. 18-18B, insulative material 90 is formed within the trenches 72. The insulative materials 38, 84, 86 and 90 together form the insulative regions 50 described above with reference to FIGS. 1-1C. Insulative material 90 may comprise any suitable composition or combination of compositions; and in some embodiments may comprise, consist essentially of, or consist of silicon dioxide.

Figure 19:
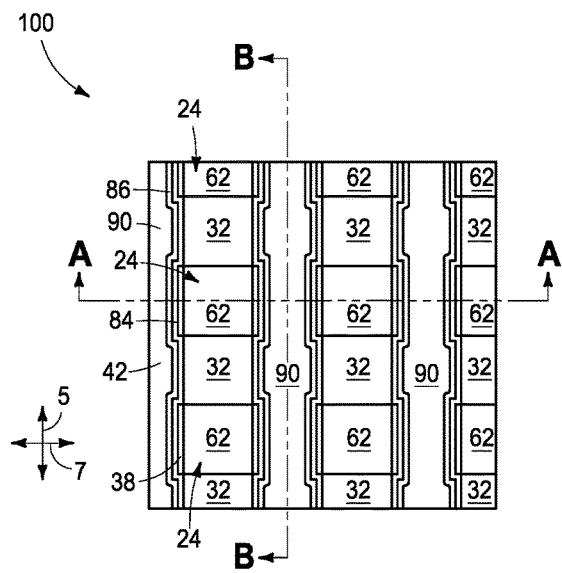
Figure 19A:
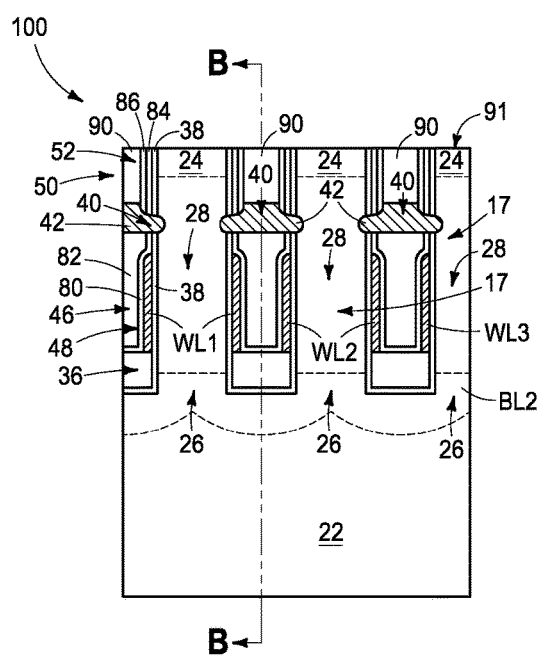
Figure 19B:
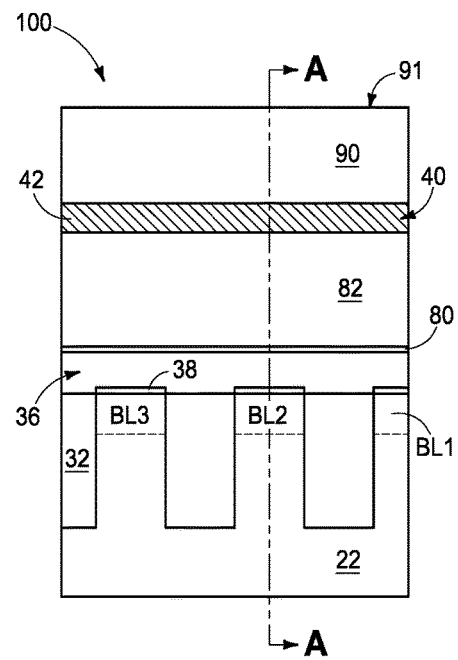

Referring to FIGS. 19-19B, the construction 100 is subjected to CMP and/or other appropriate processing to remove the hardmask material 60 and pad oxide 62 (FIGS. 18-18B), and to form the illustrated planarized upper surface 91. The construction of FIGS. 19-19B is analogous to that described above with reference to FIGS. 1-1C.

The memory arrays and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an apparatus having a transistor associated with a vertically-extending semiconductor pillar. The transistor includes an upper source/drain region within the vertically-extending semiconductor pillar, a lower source/drain region within the vertically-extending semiconductor pillar, and a channel region within the vertically-extending semiconductor pillar and between the upper and lower source/drain regions. The transistor also includes a gate along the channel region. A wordline is coupled with the gate of the transistor. A digit line is coupled with the lower source/drain region of the transistor. A programmable device is coupled with the upper source/drain region of the transistor. A body connection line is over the wordline and extends parallel to the wordline. The body connection line has a lateral edge that penetrates into the vertically-extending semiconductor material pillar. The body connection line is of a different composition than the semiconductor material pillar.

Some embodiments include an apparatus having access transistors arranged in an array comprising rows and columns. Each of the access transistors is associated with a vertically-extending semiconductor pillar and comprises an upper source/drain region within the associated vertically-extending semiconductor pillar, a lower source/drain region within the associated vertically-extending semiconductor pillar, and a channel region within the associated vertically-extending semiconductor pillar and between the upper and lower source/drain regions. Each of the access transistors also comprises a gate along the channel region. Wordlines extend along the rows and comprising the gates of the access transistors. Digit lines extend along the columns and are coupled with the lower source/drain regions of the access transistors. Programmable devices are coupled with the upper source/drain regions of the access transistors. Body connection lines are over the wordlines and extend parallel to the wordlines. The body connection lines having lateral edges that penetrate into the vertically-extending semiconductor material pillars and comprise a different composition than the vertically-extending semiconductor material pillars.

Some embodiments include an apparatus having access transistors arranged in an array comprising rows and columns. Each of the access transistors is associated with a vertically-extending semiconductor pillar and comprises an upper source/drain region within the associated vertically-extending semiconductor pillar, a lower source/drain region within the associated vertically-extending semiconductor pillar, and a channel region within the associated vertically-extending semiconductor pillar and between the upper and lower source/drain regions. Each of the access transistors also comprises a first gate portion along a first side of the channel region and a second gate portion along an opposing second side of the channel region. Wordlines extend along the rows and comprise the gates of the access transistors. Each of the wordlines has a first portion comprising the first gate portions along one of the rows, and has a second portion comprising the second gate portions along said one of the rows. Digit lines extend along the columns and are coupled with the lower source/drain regions of the access transistors. Programmable devices are coupled with the upper source/drain regions of the access transistors. Body connection lines are over the wordlines and extend parallel to the wordlines. The body connection lines are directly against the vertically-extending semiconductor material pillars and comprise a different composition than the vertically-extending semiconductor material pillars. Upper nitride liners are along the vertically-extending semiconductor pillars and over the body connection lines. Lower nitride liners are along the wordlines and under the body connection lines. The body connection lines directly contact both the upper nitride liners and the lower nitride liners.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An apparatus, comprising:
   a transistor associated with a vertically-extending semiconductor pillar and comprising an upper source/drain region within the vertically-extending semiconductor pillar, a lower source/drain region within the vertically-extending semiconductor pillar, and a channel region within the vertically-extending semiconductor pillar and between the upper and lower source/drain regions; the transistor also comprising a gate along the channel region;
   a wordline coupled with the gate of the transistor;
   a digit line coupled with the lower source/drain region of the transistor;
   a programmable device coupled with the upper source/drain region of the transistor; and
   a body connection line over the wordline and extending parallel to the wordline; the body connection line having a lateral edge that penetrates into the vertically-extending semiconductor pillar; the body connection line comprising a different composition than the semiconductor pillar.

2. The apparatus of claim 1 wherein the body connection line comprises polycrystalline silicon and the vertically-extending semiconductor pillar comprises monocrystalline silicon.

3. The apparatus of claim 1 comprising an upper nitride liner along the semiconductor pillar and over the body connection line, and comprising a lower nitride liner along the wordline and under the body connection line; the body connection line directly contacting both the upper nitride liner and the lower nitride liner.

4. The apparatus of claim 1 wherein the vertically-extending semiconductor pillar comprises a pair of opposing sidewalls along a cross-section, with said opposing sidewalls being a first sidewall and a second sidewall; wherein the gate has a first portion along the first sidewall and a second portion along the second sidewall; wherein the body connection line is one of a pair of body connection lines, with said pair of body connection lines being a first body connection line and a second body connection line; wherein the first body connection line is over the first portion of the gate and extends into the first sidewall of the vertically-extending semiconductor pillar; wherein the second body connection line is over the second portion of the gate and extends into the second sidewall of the vertically-extending semiconductor pillar; and wherein the first and second body connection lines comprise a same composition as one another.

5. An apparatus, comprising:
   access transistors arranged in an array comprising rows and columns; each of the access transistors being associated with a vertically-extending semiconductor pillar and comprising an upper source/drain region within the associated vertically-extending semiconductor pillar, a lower source/drain region within the associated vertically-extending semiconductor pillar, and a channel region within the associated vertically-extending semiconductor pillar and between the upper and lower source/drain regions; each of the access transistors also comprising a gate along the channel region;

wordlines extending along the rows and comprising the gates of the access transistors;

digit lines extending along the columns and being coupled with the lower source/drain regions of the access transistors;

programmable devices coupled with the upper source/drain regions of the access transistors; and body connection lines over the wordlines and extending parallel to the wordlines; the body connection lines having lateral edges that penetrate into the vertically-extending semiconductor pillars and comprising a different composition than the vertically-extending semiconductor pillars.

6. The apparatus of claim 5 wherein the body connection lines are all held at a common voltage.

7. The apparatus of claim 5 wherein the body connection lines comprise polycrystalline silicon and the vertically-extending semiconductor pillars comprise monocrystalline silicon.

8. The apparatus of claim 5 wherein the programmable devices comprise charge-storage devices.

9. The apparatus of claim 5 wherein the programmable devices comprise capacitors.

10. The apparatus of claim 9 wherein the capacitors and access transistors together comprise 1-transistor-1-capacitor (1T1C) memory cells.

11. The apparatus of claim 9 wherein the capacitors and access transistors together comprise 2-transistor-1-capacitor (2T1C) memory cells.

12. The apparatus of claim 5 wherein the vertically-extending semiconductor pillars extend upwardly from a base of semiconductor material; and wherein the digit lines comprise conductively-doped regions extending along the columns and within lower regions of the semiconductor pillars above the base of semiconductor material.

13. The apparatus of claim 5 wherein the vertically-extending semiconductor pillars extend upwardly from a base of semiconductor material; and wherein the digit lines comprise metal-containing lines extending along the columns and within lower regions of the semiconductor pillars above the base of semiconductor material.

14. The apparatus of claim 5 wherein the vertically-extending semiconductor pillars extend upwardly from a base of semiconductor material; and wherein the digit lines comprise metal-containing lines extending along the columns and within lower regions of the semiconductor pillars above the base of semiconductor material, and comprise conductively-doped regions above the metal-containing lines and extending along the metal-containing lines.

15. An apparatus, comprising:

access transistors arranged in an array comprising rows and columns; each of the access transistors being associated with a vertically-extending semiconductor pillar and comprising an upper source/drain region within the associated vertically-extending semiconductor pillar, a lower source/drain region within the associated vertically-extending semiconductor pillar, and a channel region within the associated vertically-extending semiconductor pillar and between the upper and lower source/drain regions; each of the access transistors also comprising a first gate portion along a first side of the channel region and a second gate portion along an opposing second side of the channel region;

wordlines extending along the rows and comprising the gates of the access transistors; each of the wordlines having a first portion comprising the first gate portions along one of the rows, and having a second portion comprising the second gate portions along said one of the rows;

digit lines extending along the columns and being coupled with the lower source/drain regions of the access transistors;

programmable devices coupled with the upper source/drain regions of the access transistors;

body connection lines over the wordlines and extending parallel to the wordlines; the body connection lines being directly against the vertically-extending semiconductor pillars and comprising a different composition than the vertically-extending semiconductor pillars;

upper nitride liners along the vertically-extending semiconductor pillars and over the body connection lines;

lower nitride liners along the wordlines and under the body connection lines; and the body connection lines directly contacting both the upper nitride liners and the lower nitride liners.

16. The apparatus of claim 15 wherein the body connection lines have lateral edges that penetrate into the vertically-extending semiconductor pillars; and wherein each body connection line is over a first portion of one wordline and is over a second portion of a second wordline adjacent said one wordline.

17. The apparatus of claim 15 wherein the body connection lines comprise polycrystalline silicon and the vertically-extending semiconductor pillars comprise monocrystalline silicon.

18. The apparatus of claim 15 wherein the upper nitride liners are spaced from the vertically-extending semiconductor pillars by silicon dioxide.

19. The apparatus of claim 15 wherein the upper and lower nitride liners consist of silicon nitride.

20. The apparatus of claim 15 wherein the programmable devices comprise capacitors.

21. The apparatus of claim 20 wherein the capacitors and access transistors together comprise 1-transistor-1-capacitor (1T1C) memory cells.

22. The apparatus of claim 20 wherein the capacitors and access transistors together comprise 2-transistor-1-capacitor (2T1C) memory cells.

* * * * *